(12) United States Patent
Ando et al.

(10) Patent No.: US 7,364,714 B2
(45) Date of Patent: Apr. 29, 2008

(54) 3C-SIC NANOWHISKER AND SYNTHESIZING METHOD AND 3C-SIC NANOWHISKER

(75) Inventors: Toshihiro Ando, Ibaraki (JP); Mika Gamo, Ibaraki (JP); Yafei Zhang, Ibaraki (JP)

(73) Assignees: Japan Science and Technology Agency, Saitama (JP); National Institute for Materials Science, Ibaraki (JP)

( * ) Notice: Subject to any disclaimer, the term of this patent is extended or adjusted under 35 U.S.C. 154(b) by 263 days.

(21) Appl. No.: 10/481,578

(22) PCT Filed: Jun. 21, 2002

(86) PCT No.: PCT/JP02/06236

§ 371 (c)(1),
(2), (4) Date: Dec. 22, 2003

(87) PCT Pub. No.: WO03/000965

PCT Pub. Date: Jan. 3, 2003

(65) Prior Publication Data

US 2005/0089680 A1    Apr. 28, 2005

(30) Foreign Application Priority Data

Jun. 25, 2001    (JP) .............................. 2001-191226

(51) Int. Cl.
*C01B 31/36* (2006.01)
(52) U.S. Cl. ................. 423/345; 423/DIG. 10
(58) Field of Classification Search ............... 423/345, 423/346, DIG. 10
See application file for complete search history.

(56) References Cited

U.S. PATENT DOCUMENTS 5,116,679 A * 5/1992 Nadkarni et al. ........... 428/367
5,178,847 A * 1/1993 Judin et al. .................. 423/344
5,363,800 A * 11/1994 Larkin et al. ............... 438/507
5,514,350 A * 5/1996 Kear et al. .................. 422/198
6,221,154 B1   4/2001 Lee et al.

FOREIGN PATENT DOCUMENTS

JP    62-036100    2/1987
JP    10-203810    8/1998

OTHER PUBLICATIONS

X. T. Zhou et al.; Chemical Physics Letters, vol. 318, pp. 58-62, Feb. 18, 2000. Cited in the search report.
H. L. Lai et al.; Applied Physics Letter, vol. 76, No. 3, pp. 294-296, Jan. 17, 2000. Cited in the search report.

* cited by examiner

*Primary Examiner*—Edward M. Johnson
(74) *Attorney, Agent, or Firm*—Westerman, Hattori, Daniels & Adrian, LLP.

(57)    ABSTRACT

3C—SiC nanowhisker and a method of synthesizing 3C—SiC nanowhisker wherein its diameter and length can be controlled. The method is safe and low cost, and the whisker can emit visible light of various wavelengths. 3C—SiC nanowhisker is formed by depositing thin film (2) made of a metal element on Si substrate (1), placing this Si substrate (1) into a plasma CVD apparatus, and holding it for predetermined time at predetermined substrate temperature in the plasma consisting of hydrogen and hydrocarbon. Si of Si substrate (1) and C in plasma dissolve at supersaturation into metal liquid particle (3), 3C—SiC nanowhisker (4) grows on the metal liquid particles (3), whisker surface is terminated with H so as to maintain the diameter constant, and the metal liquid particles (3) at whisker root take in Si from Si substrate (1) and penetrate into Si substrate (1).

10 Claims, 9 Drawing Sheets

3c-SiC (β-SiC)

3C-SIC NANOWHISKER AND SYNTHESIZING METHOD AND 3C-SIC NANOWHISKER

TECHNICAL FIELD

The present invention relates to 3C—SiC nanowhisker and nanowhiskers, having cubic lattice, nanometer size diameter, and chemical formula SiC, and relates to the synthesizing method of the same.

PRIOR ART

Crystalline materials having a size of nanometer are well known such as nanotubes, nanorods, and nanowhiskers. Such crystalline materials of nanometer size have specific geometrical and structural characteristics, therefore, for example, carbon nanotube can be used as electric field emission type electron source, storage system of chemical species, and mechanical reinforcing material.

As those crystalline materials of nanometer size are the materials of having such very microscopic dimension as nanometer, they show various quantum size effects which bulky materials can not show. If those crystalline materials of nanometer size can be synthesized with their sizes controlled, their quantum effect can be controlled and then a nanoscale quantum device can be obtained.

Figure 9:
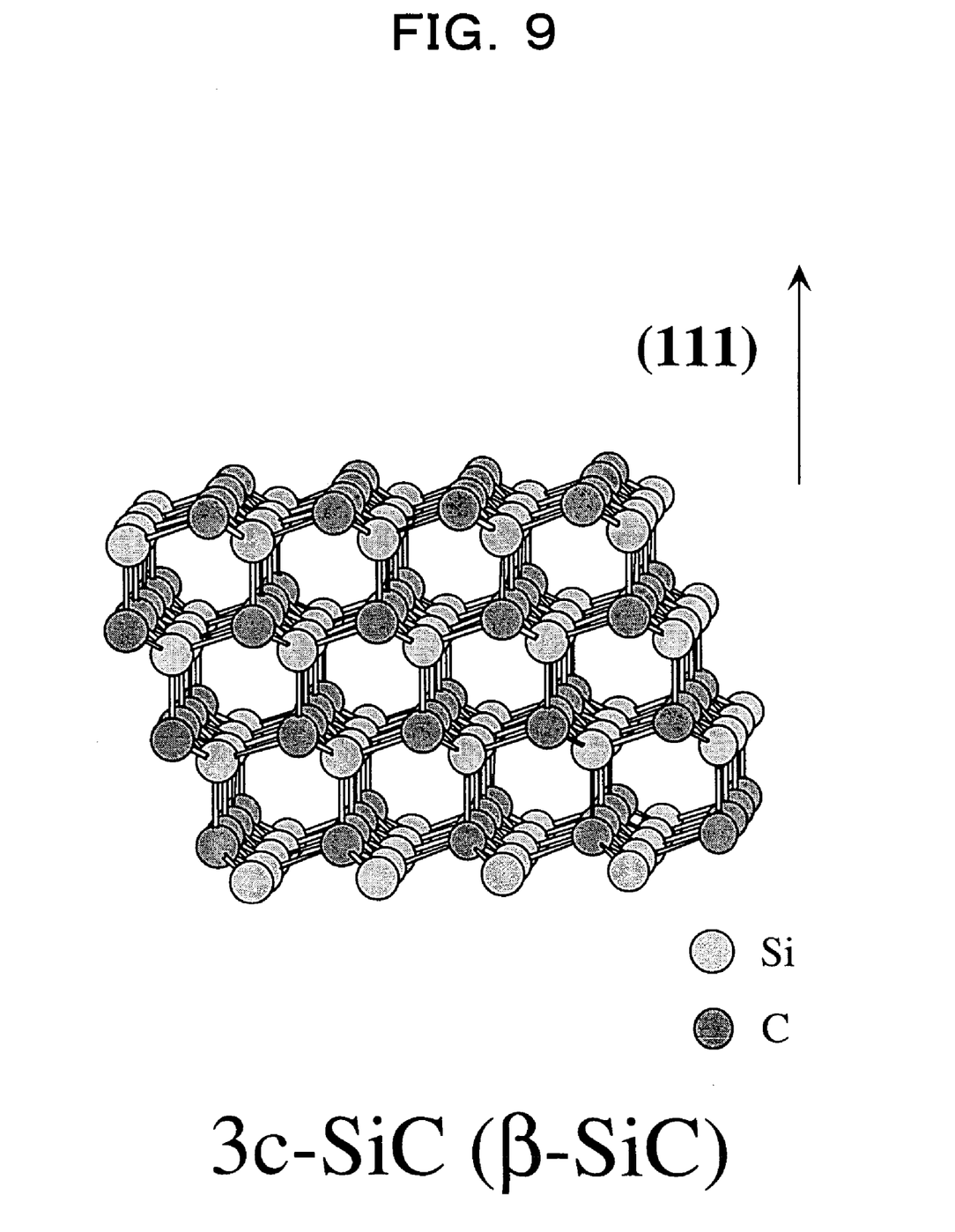
FIG. 9 shows the crystalline structure of 3C—SiC.

If a semiconductor crystalline material having indirect transition type band structure in bulk form is formed into nanometer size, its band type changes to direct transition type because of quantum size effect and then it can emit lights. For example, as shown in the attached figure FIG. 9, bulk cubic crystal of SiC(silicon carbide) called as 3C—SiC (or β-SiC) has band-gap energy of 2.3 eV which is equivalent to the wavelength of visible spectrum 540 nm, high carrier mobility and high saturation drift velocity. But it can not have been used for light-emitting device or light-receiving device because of its indirect transition type band structure.

If 3C—SiC nanowhisker having a size of nanometer can be synthesized, the indirect transition type band structure of 3C—SiC in bulk form changes to direct transition type band structure by quantum confinement effect, and then it becomes possible to use 3C—SiC nanowhisker having a size of nanometer for optoelectronic device. Moreover, if the diameter of 3C—SiC nanowhisker can be controlled, it becomes possible to emit visible light of any desired wave length from this 3C—SiC nanowhisker because the band width can be controlled by quantum confinement effect.

If also the 3C—SiC nanowhisker of nanometer size can be grown on Si substrate, conventional Si device and the device formed by the 3C—SiC nanowhisker can be integrated on the same substrate, and then an optoelectronic one chip device operable in high functions can be realized.

As mentioned above, if the 3C—SiC nanowhisker can be synthesized, if its diameter can be controlled, and if it can be grown on Si substrate, so formed 3C—SiC nanowhisker can be used not only as a raw material of having high carrier mobility and high saturation drift velocity for high speed electronic device of next generation, but also, by utilizing its wide band-gap energy, as a raw material for device being operable in high temperature environment at high power operation, for device being resistant in submicron-wavelength-radiation field, for luminescent device, and as well as for optoelectronic device In prior art of synthesizing SiC whisker, to synthesize thick SiC whisker with diameters of micrometer size is known. This art is to grow whisker on graphite substrate by thermo-chemical vapor deposition method at very high temperature(>1250° C.) (Appl. Phys. Lett., 72, 1835p, 1998). The SiC whisker by this method has the diameter of micrometer size, and does not show quantum confinement effect, and hence does not emit visible light. Since it is deposited on graphite substrate, it is difficult to make device from this SiC whisker. Since this synthesizing method uses Such poisonous and flammable gas as silane($Si_nH_{2n+2}$) for Si source, it requires a large scale apparatus with various equipment for safety and as the result costs high.

There is also a method called boundary reaction method that SiO or solid mixture comprising of Si, C and O is evaporated on the surface of carbon nanotube by hot filament method and these evaporated solid mixture are reacted with the carbon nanotubes (Mater. Sci., 18, 1255, 1999; appl. Phys. Lett., 74, 3942, 2000). Although the size of SiC whisker source, it requires a large scale apparatus with various equipment for safety and as the result costs high.

There is also a method called boundary reaction method that SiO or solid mixture comprising of Si, C and O is evaporated on the surface of carbon nanotube by hot filament method and these evaporated solid mixture are reacted with the carbon nanotubes (Mater. Sci., 18, 1255, 1999; appl. Phys. Lett., 74, 3942, 2000). Although the size of SiC whisker by this method is nanometer, its surface is oxidized and therefore it could not be used as a semiconductor material.

As mentioned above, the 3C—SiC nanowhisker has very many fields of utilization, but has had so far no method of the manufacture. With the aforementioned subject and prior-art problems taken into account, the present invention has for its objects to provide a synthesizing method of 3C—SiC nanowhisker that allows to grow 3C—SiC nanowhisker, and nanowhiskers of which the diameter and the length are controlled on Si substrate, and to synthesize it at low cost. Also there is another object to provide 3C—SiC nanowhisker which can emit visible lights.

DISCLOSURE OF THE INVENTION

In order to achieve the object described above, the synthesizing method of 3C—SiC nanowhisker according to the present invention characterized in that it comprises the steps of: depositing a thin film composed of a metal element or metal elements on Si substrate; and holding this substrate in a plasma consisting of hydrogen and hydrocarbon for predetermined time period at predetermined substrate temperature, wherein the diameter of said 3C—SiC nanowhisker is controlled by controlling the thickness of said thin film, and said 3C—SiC nanowhisker is grown perpendicular to said Si substrate.

It can be possible for said metal element to select one element or more elements from the group which consists of Fe, Co and Ni. It is preferable to control the length of said 3C—SiC nanowhisker by controlling said holding time period of the Si substrate and said Si substrate temperature.

According to the method mentioned above, the 3C—SiC nanowhisker which has its root buried in the Si substrate can grow on the substrate surface. Also, by controlling the thickness of said thin film of the metal element, it is possible to grow 3C—SiC single crystal nanowhisker having a desired diameter being proportional to the thickness of said thin film. Further, it is possible to control the length of the 3C—SiC single crystal nanowhisker by controlling said Si substrate temperature.

According to the synthesizing method of 3C—SiC nanowhisker of the present invention, since it uses solid Si for the source of Si element, it is possible to synthesize 3C—SiC single crystal nanowhisker quite safely and at low cost.

According to the synthesizing method of 3C—SiC nanowhisker of the present invention, the thin film of a metal element or metal elements becomes fine particles composed of metal liquid having a nanometer size, the particles are distributed insularly and densely on the Si substrate surface by heating the Si substrate, the particles are dissolved with Si atoms from the Si substrate and C atoms from the plasma being supersaturated, the dissolved Si and C atoms crystallize on the surface of the particle to form the nuclei of the whisker, and the nuclei are grown to form the nanowhisker with Si and C atoms continuously supplied from the particle, while the diameter of the whiskers is kept constant because the surface of the whiskers are terminated with hydrogen atoms from the plasma.

The metal liquid fine particle which is existing at the root of the whisker, penetrates into the Si substrate by dissolving the Si atoms of the Si substrate into which, forms silicide with the Si substrate, and is tightly fixed with the Si substrate.

For use of the above mentioned Si substrate, any face oriented substrate may be usable, and also polycrystalline substrate may be usable. The metal element may preferably be Fe, and hydrocarbon may be selected from any one of the group of paraffin hydrocarbon expressed by chemical formula $C_nH_{2n+2}$, for example, methane, ethane, or butane. The preferred film thickness of thin film of Fe may be 5 to 105 nm. The substrate temperature in the plasma of hydrogen and hydrocarbon may preferably be in the range of 800 to 1100° C. The plasma herein may be microwave plasma.

According to the synthesizing method of 3C—SiC nanowhisker according to the present invention described above, the 3C—SiC nanowhisker of desired diameter in the range of 8 to 50 nm can be synthesized depending on the film thickness of Fe thin film.

The 3C—SiC nanowhisker according to the present invention is characterized by the diameter of nanosize thereof, by the cubic crystal lattice thereof, by the chemical formula SiC thereof, and by the growing perpendicular to the Si substrate. The whisker diameter can be selected to any one of the diameter in the preferred range of 8 to 50 nm, and its diameter is uniform in the direction of axis thereof. The root thereof is buried in the Si substrate and tightly fixed with it, and the whisker grows nearly perpendicular to the Si substrate surface. The wavelength of the emitted light can be differed depending on the diameter thereof.

The 3C—SiC nanowhisker of the present invention can emit visible light owing to quantum confinement effect, and can vary wavelength of the emitted light by the diameter thereof. Therefore, for example, a display device which can emit more than one wavelength can be obtained by forming the 3C—SiC nanowhiskers with various diameters. Also, various electronic devices of making from Si and of light-emitting devices making from 3C—SiC nanowhiskers can be formed on the same Si substrate. Since the nanowhiskers are tightly and densely fixed on the substrate, it is very easy to handle these for making use of various devices.

BRIEF DESCRIPTION OF THE FIGURES

The present invention can be better understood by detailed description below and the attached figures showing the forms of embodiments of some of the present inventions. Here the forms of embodiments shown in these attached figures are intended not to limit the limit the present invention, but to describe the present invention and help understanding thereof.

DETAILED DESCRIPTION OF THE INVENTION

Hereinafter, the present invention will be described in detail with reference to suitable forms of implementation thereof illustrated in the drawing figures.

First, the synthesizing process of 3C—SiC nanowhisker according to the present invention is described. In the first process, Si substrate surface is cleaned with organic solvents and such acid as hydrofluoric acid. In the second process, metal thin film is deposited on the cleaned Si substrate by means of such film-forming method as spattering. In this process the thickness of the metal thin film is chosen depending on the aimed diameter of the 3C—SiC nanowhisker. In the third process, the Si substrate with the metal thin film deposited thereon is set in plasma CVD apparatus, hydrogen and hydrocarbon gases are flown at predetermined flow rate, and plasma discharge is excited while predetermined pressure is being maintained. A controlling device for the substrate temperature may not necessarily be used, but it may be controlled with heat of the plasma radiation by controlling the plasma discharging power properly. The 3C—SiC nanowhisker can be formed by holding the substrate for predetermined time in the plasma discharged with predetermined power.

Figure 1:
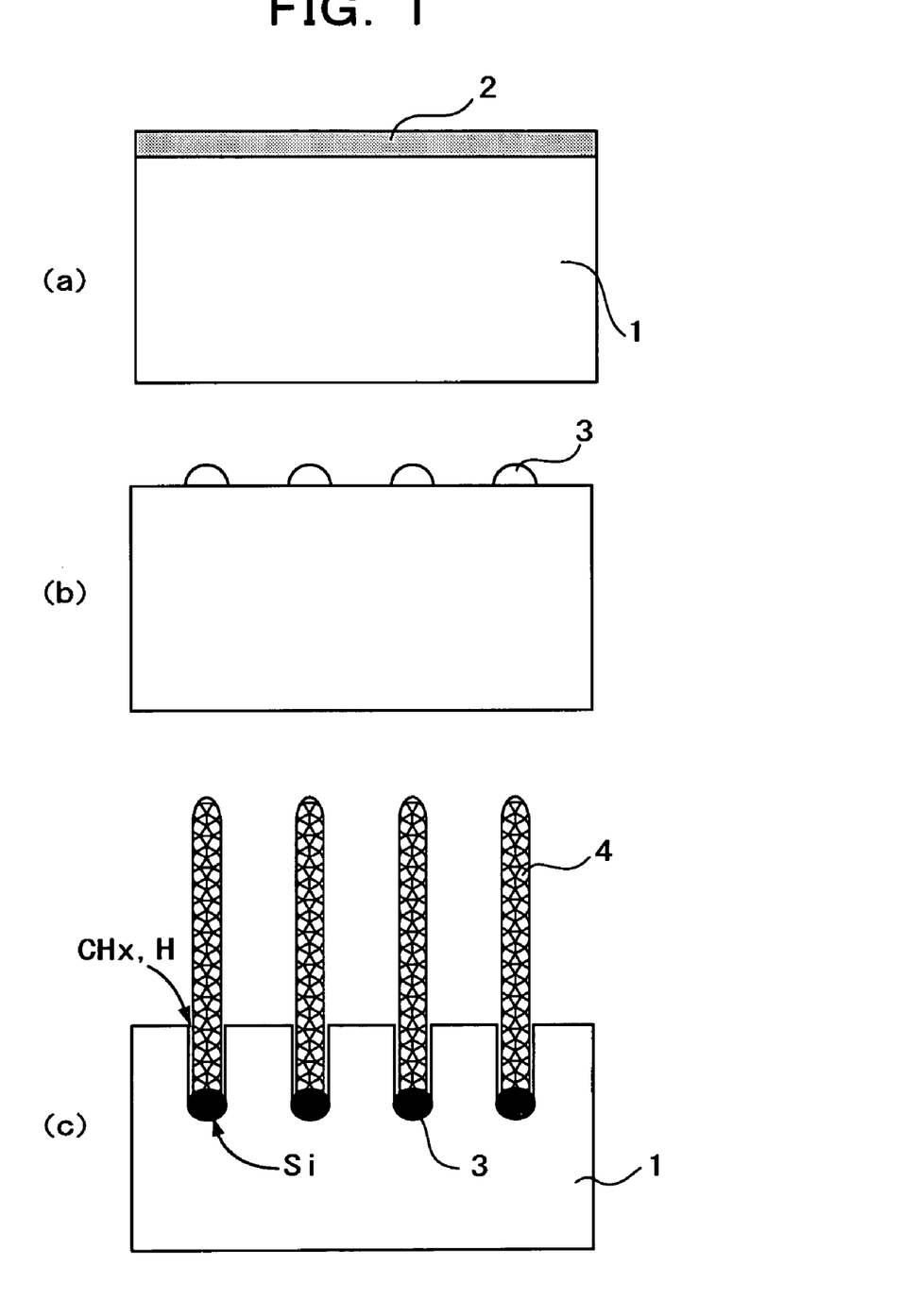
FIG. 1 shows the forming mechanism of 3C—SiC nanowhisker according to the present inventions and (a) is a typical cross sectional view illustrating Si substrate deposited with metal thin film, (b) is a typical cross sectional view illustrating the distribution of metal liquid fine particles on Si substrate, and (c) is a typical cross sectional view illustrating the growth of whisker.

The forming mechanism of 3C—SiC nanowhisker of the present invention can be considered as below. FIG. 1 is the figure illustrating the forming mechanism of 3C—SiC nanowhisker of the present invention. According to the synthesizing method of 3C—SiC nanowhisker of the present invention, metal thin film 2 deposited on Si substrate 1 becomes liquid phase by heating the Si substrate 1, and simultaneously metal liquid phase are formed into fine particles 3 being distributed insularly on the Si substrate 1, as shown in FIGS. 1(*a*) and (*b*). The particle diameter of liquid fine particle 3 is large if metal thin film 2 is thick, and small if it is thin Liquid fine particles 3 of the desired nanometer size can be distributed insularly with desired density on Si substrate by choosing properly the kind of metal element, the thickness of metal thin film, and the substrate temperature.

As shown in FIG. 1(*c*), silicon(Si) of Si substrate 1 and carbon(C) from the hydrocarbon decomposed in the plasma dissolve into metal liquid fine particle 3 being supersaturated. The dissolved Si and C atoms supersaturated crystallize on the surface of metal liquid fine particles 3 to form the nuclei of whisker 4, Si and C atoms are continuously supplied to the nuclei from metal liquid fine particles 3 to grow whisker 4, while the growth for the direction perpendicular to the surface of whisker 4 being prevented because of the atoms forming the surface of thus grown whisker 4 being terminated with hydrogen atoms from the plasma, and thus, 3C—SiC nanowhisker can grow while maintaining whisker diameter 4 constant. By choosing growth time, the length in the axis direction of whisker 4 can be controlled. The metal liquid fine particles 3 existing at the root of the whisker 4 penetrate into Si substrate with dissolving Si atoms of the Si substrate into the metal liquid fine particles 3, form silicide with Si substrate, and so the 3C—SiC nanowhisker is tightly fixed on the Si substrate 1.

By using the synthesizing method of 3C—SiC nanowhisker of the present invention, 3C—SiC nanowhiskers with desired diameter and length being densely and tightly fixed on Si substrate are obtained. Also by using this method, solid Si, not such dangerous gas as silane, can be used as Si atom source, so that the synthesizing is safe and it can be provided at low cost.

The whisker of the present invention is described by the chemical formula SiC, forms cubic lattice, and is a single crystal whisker with nanosize diameter. The diameter of the 3C—SiC nanowhisker can be arbitrarily chosen from the range 8 to 50 nm, and it is uniform in the direction of whisker axis. Its root is buried and fixed in the Si substrate, and it grows densely and nearly perpendicular to Si substrate surface.

The 3C—SiC nanowhisker of the present invention emits visible light by quantum confinement effect, and can vary the wavelength of the emitted light by its diameter, Also, Si device and device made of the 3C—SiC nanowhisker can be formed together on the same Si substrate For example, a very compact display device which emit lights with more than one wavelengths can be realized, by forming the light emission device made of the 3C—SiC nanowhiskers varying the diameter and by forming various electronic devices made of Si on the same Si substrate for controlling the emission of the light emission device made of the 3C—SiC nanowhiskers.

The implementations of the present invention are described below. The Si(100) substrate having mirror surface of 10×20×1 mm$^3$ was cleaned ultrasonically using ethanol and etched for 3 minutes with 3% conc. HF solution. Next, Fe thin film was deposited on this Si substrate by spattering method in Ar atmosphere. Here, the samples of various film thickness of Fe thin film were prepared. The Si substrate with Fe thin film deposited was set in a microwave plasma CVD apparatus. This microwave plasma CVD apparatus is a horizontal type with a quartz tube chamber set in horizontally, and the Si substrate is set vertically in this quartz tube. After that, The quartz tube chamber was pumped to vacuum of about 0.5 m Torr, and $H_2$ gas at 100 SCCM and $CH_4$ gas at about 0.05 SCCM flow rate were introduced, and the vacuum of 40 Torr was maintained. And microwave plasma of 420-550 W was excited. Si substrate was heated by microwave plasma, and its temperature was measured by optical-pyro thermometer focused on the surface of Si substrate. The growth time was 6 hours. The 3C—SiC nanowhisker was able to grow in the substrate temperature range of 800-1100° C.

The 3C—SiC nanowhisker grown on the Si substrate looked like with a naked eye a thin layer of dust. The growth rate of the 3C—SiC nanowhisker increased with increasing of the substrate temperature, and its length increased with increasing of the growth time.

Figure 2:
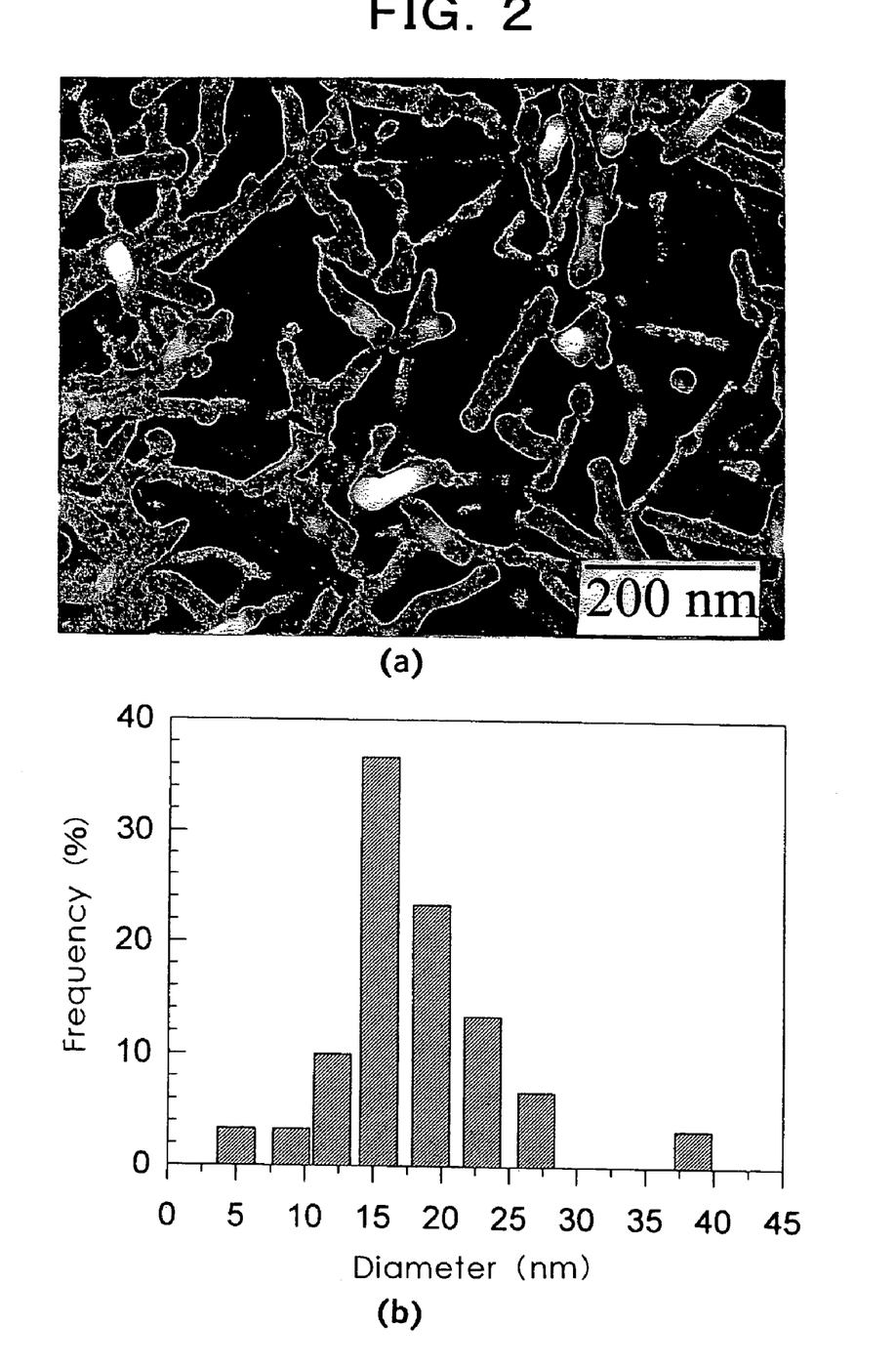
FIG. 2(a) shows SEM(Scanning Electron Microscopy) image of the sample surface synthesized according to the present invention.
FIG. 2(b) shows the distribution of diameters of the 3C—SiC nanowhisker synthesized according to the present invention.

FIG. 2 shows 3C—SiC nanowhisker grown with Fe thin film of 24 nm thickness and at substrate temperature of 900° C. FIG. 2(*a*) shows SEM(Scanning Electron Microscopy) image of the sample surface, and FIG. 2(*b*) shows the distribution of diameters of the formed 3C—SiC nanowhiskers. As are seen in FIG. 2, the whole surface of Si substrate was covered with the 3C—SiC nanowhiskers, and its diameter was distributed in the range of 5-38.5 nm with the distribution peak at 15.4 nm. It is also seen that the density of 3C—SiC nanowhisker was uniform over the Si substrate surface. Its length was 1.5-2.1 micrometer. Its axis direction was nearly perpendicular to Si substrate surface.

The chemical component analysis by EDX(Energy Dispersive X-ray spectroscopy) equipped with the SEM and the TEM (Transmission Electron Microscopy) showed approximately the same composition ratio Si/C of standard SiC sample.

Figure 3:
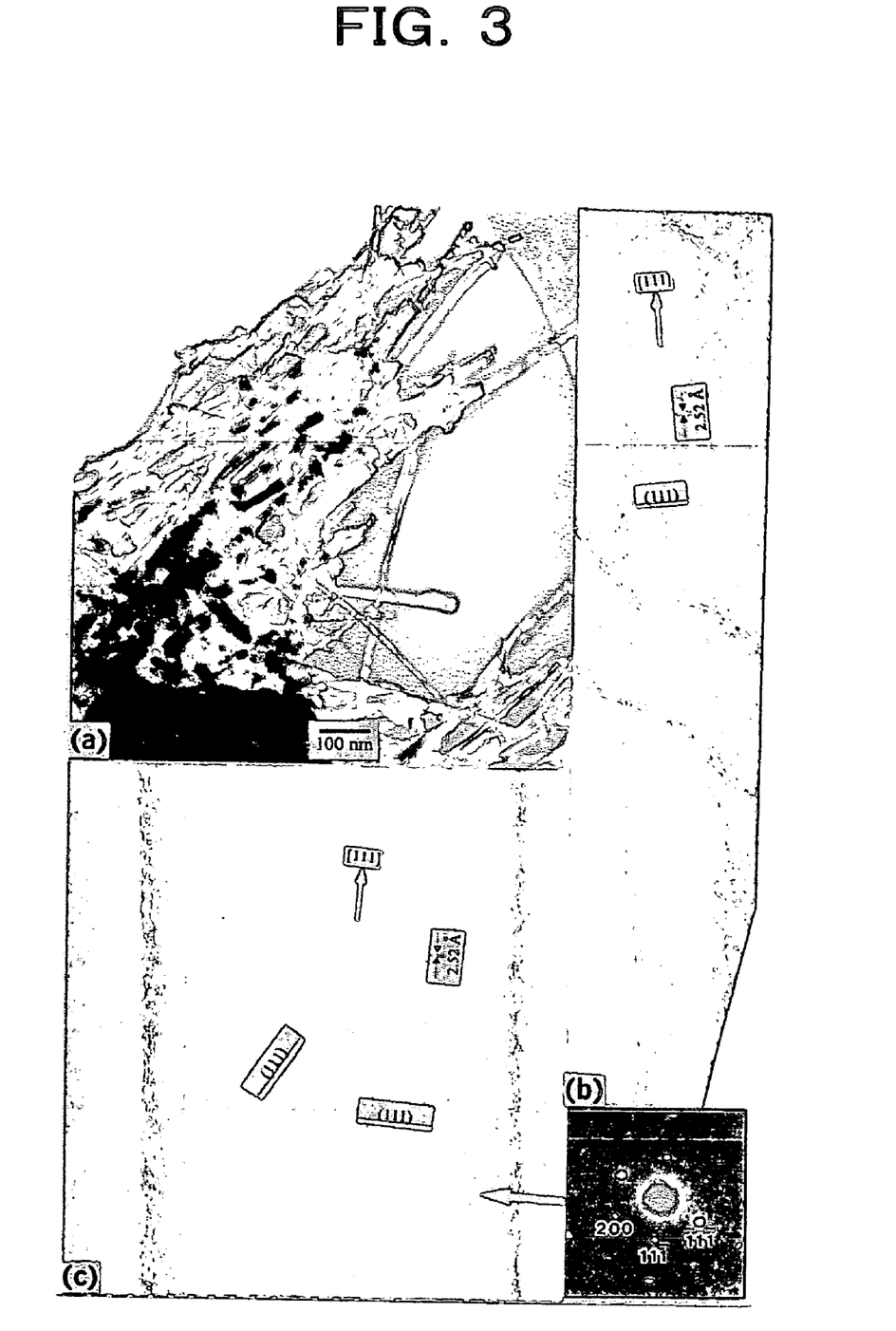
FIG. 3 shows TEM image and electron beam diffraction image of the whisker synthesized according to the present invention observed by TEM.
Figure 4:
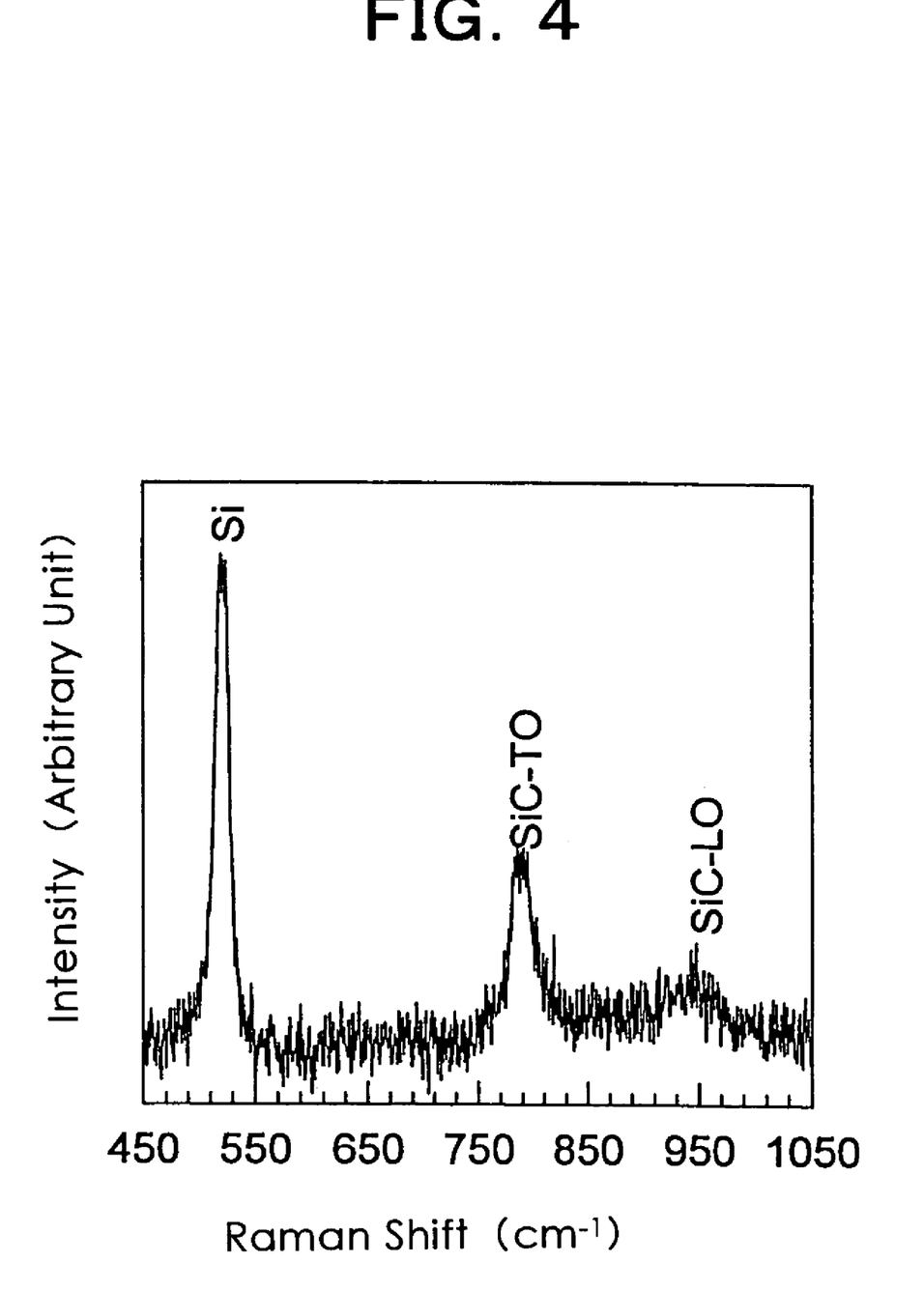
FIG. 4 is the graph showing the observed result of confocal micro-Raman spectrum of the whisker synthesized according to the present invention observed at room temperature by focusing excitation light on the whisker.

FIG. 3 shows TEM image and electron beam diffraction image of the whisker of the present invention measured by TEM. As is seen in FIG. 3(*a*), the whisker of the present invention has basically smooth surface and thin and long form. It was also seen that this whisker was almost straight and showed no bent or distortion. Most of these whiskers had cylindrical form with circular cross section, and some others had cylindrical form with cross sections of square, rectangle, triangle, and hexagon. However, all the whiskers of diameter 10 nm or less had circular cross section. FIG. 3(*b*) and (*c*) are the high magnitude TEM images of the whiskers with diameter 11 nm and 45 nm respectively. As is seen from these figures, these whiskers have the structure of single crystal 3C—SiC. The axis of whiskers was nearly along the [111] direction of 3C—SiC crystal. Oxidation was not observed on the whisker surface after it was exposed to the air, this property is the oxidation-resistant property of 3C—SiC compound. The SAED(Selected-Area Diffraction) pattern of the whisker is shown in lower right side of FIG. 3(*c*). This diffraction image was obtained by irradiating electron beam parallel to 3C—SiC crystal [011] direction. The 200 diffraction spot in the diffraction pattern are a typical character of the 3C—SiC crystal structure owing to the asymmetric effect of the elements C and Si in the crystal lattice, because the 200 diffraction spot are forbidden Or could arise weakly from double diffraction inhibiting rule of a single crystal like Si and diamond, FIG. 4 shows the measured result of confocal micro-Raman spectrum at room temperature by focusing Raman excitation light on the whisker on Si substrate. Since 3C—SiC nanowhisker is the semiconductor having wide energy gap, the light penetration depth is fairly deep, and the 520 cm$^{-1}$ peak with 15 cm$^{-1}$ full width at half maximum was main peak among the first order Raman peaks from Si substrate surface. The 788 cm$^{-1}$ peak corresponding to horizontal optical phonon(TO) and the about 950 cm$^{-1}$ peak corresponding to vertical optical phonon(LO) show that this nanowhisker has 3C—SiC crystal structure. The full width at half maximum of TO peak is 27 cm$^{-1}$, and its peak position is 5 cm$^{-1}$ lower than that of the reported data of bulk 3C—SiC($\omega_{TO}$=793 cm$^{-1}$, FWHM<10 cm$^{-1}$). TO mode of Raman scattering from 3C—SiC nanowhisker is larger than LO mode that can be derived from selection rule based on the structure of the whisker growing in the direction of 3C—SiC crystal [111] axis on the Si substrate.

In order to investigate the property of 3C—SiC nanowhisker formed on Si (100) substrate, a series of samples were prepared by depositing Fe thin film with various film thickness and synthesizing at various substrate temperatures. It was found as the result that nanowhisker can be grown in the range of substrate temperature 800-1000° C., and with Fe thin film thickness 9-105 nm. The diameters of all the nanowhisker were smaller than the thickness of Fe thin film. 90 nanowhiskers were chosen from each of all the samples, their diameters were measured, the most frequently occuring diameter was determined, and the dependency of the most frequently occuring diameter on the substrate temperature and an the thickness of Fe thin film were obtained.

Figure 5:
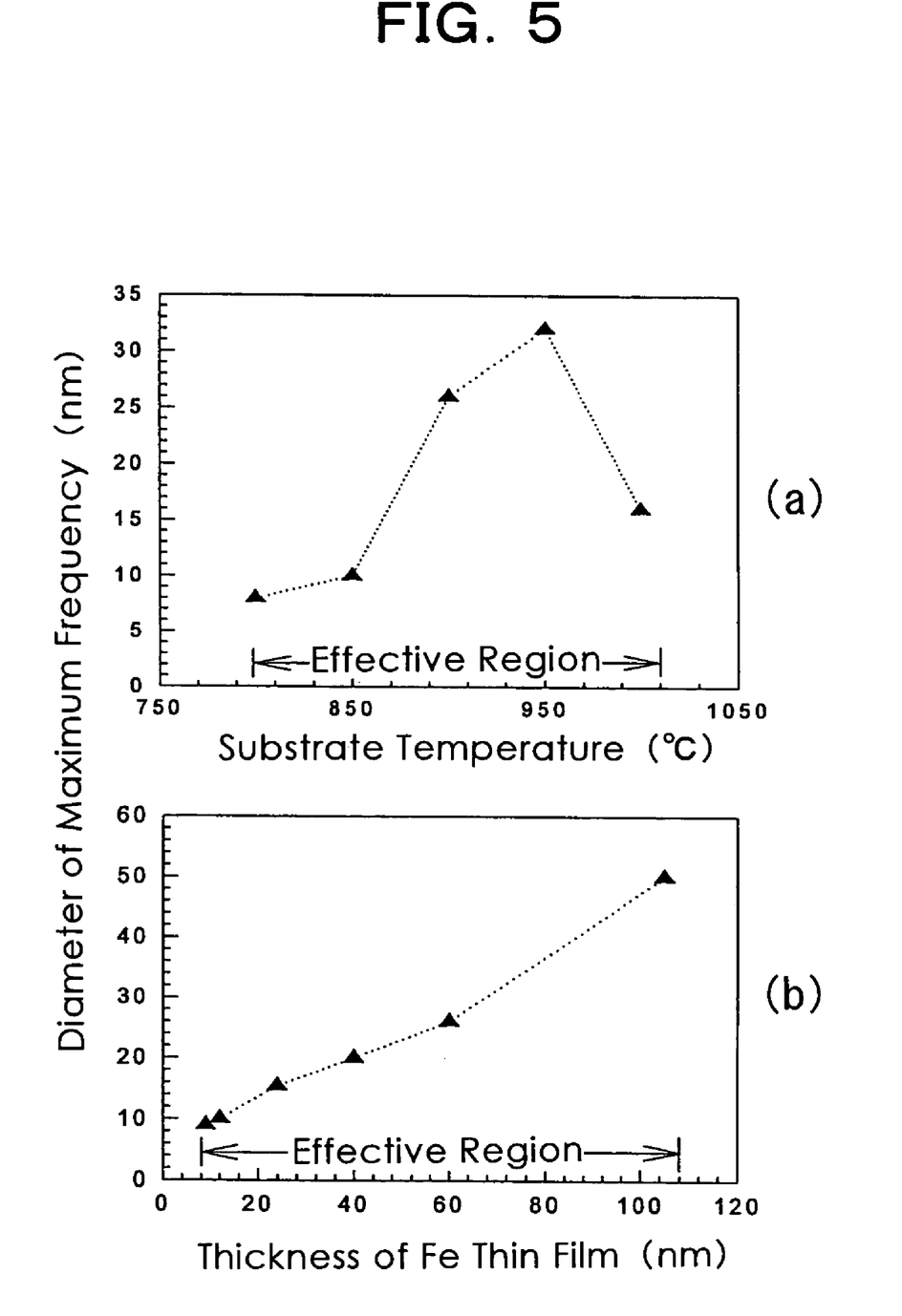
FIG. 5 shows the dependency of diameter of the 3C—SiC nanowhisker synthesized according to the present invention on the substrate temperature and on the thickness of Fe thin film, and (a) is the graph showing the dependency on the substrate temperature, and (b) shows the dependency on the thickness of Fe thin film.

FIG. 5 shows the dependency on the substrate temperature and on the thickness of Fe thin file and FIG. 5(a) shows the dependency on the substrate temperature with constant Fe thin film thickness, and FIG. 5(b) is the dependency on the thickness of Fe thin film at constant substrate temperature. As is clearly seen from FIGS. 5(a), (b) the diameter which is 8 nm at the substrate temperature 800° C., increases with increase of the temperature, reaches to its maximum 32 nm at the temperature 950° C., and then decreases with increase of the temperature from 950° C. to 1000° C., and the diameter increased monotonically from 9 nm to 58 nm with increase of the thickness of Fe thin film from 9 nm to 105 nm.

This indicates that the mechanism governing diameter is dependent on the size of Fe liquid fine particle on the substrate surface. Since too thick Fe thin film which can not melt at the used substrate temperature can not form liquid fine particle, nanowhisker can not grow. On the other hand, nanowhisker also can not grow with too thin Fe thin film, for example, at least 9 nm or more is necessary as the thickness of Fe thin film to grow 3C—SiC nanowhisker at the substrate temperature 900° C.

Figure 6:
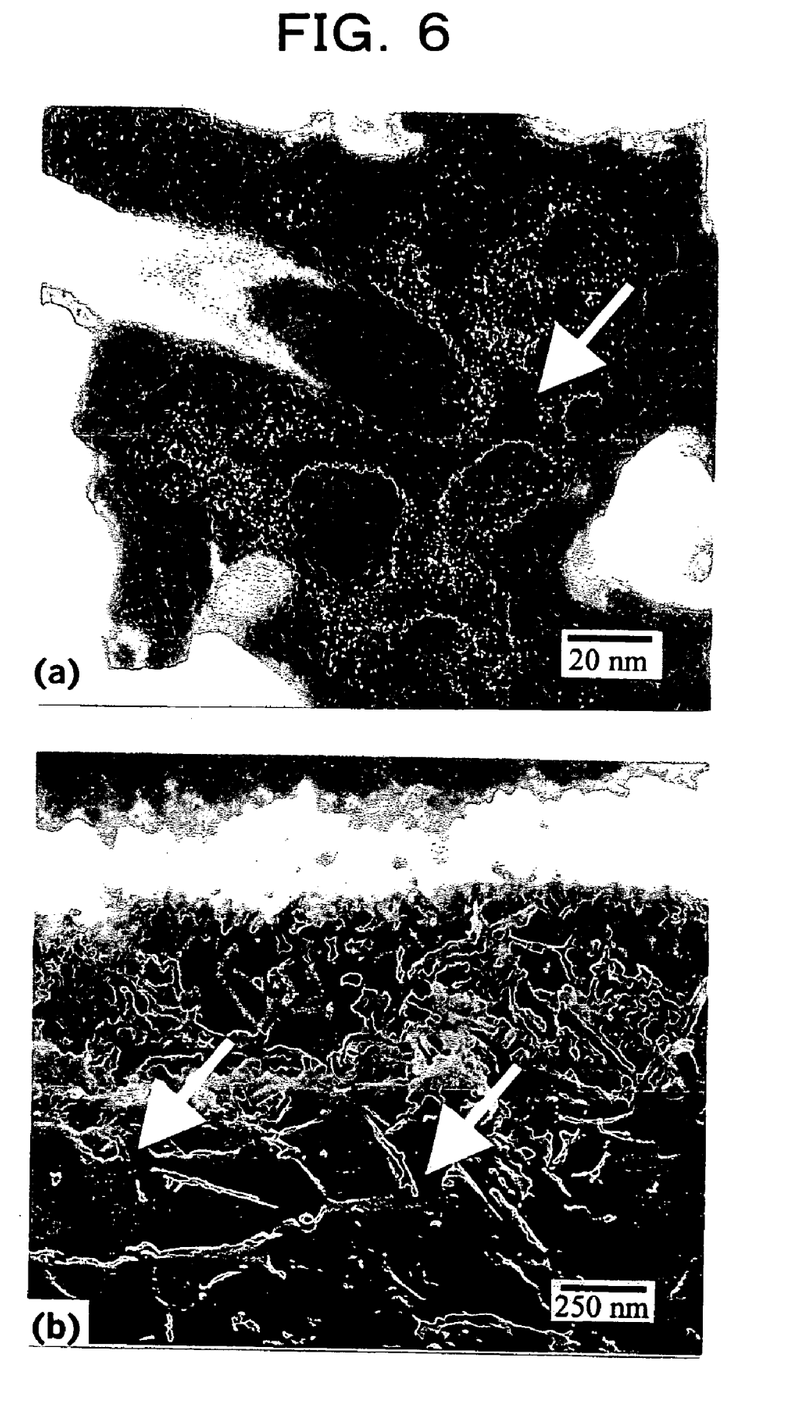
FIG. 6 shows how the 3C—SiC nanowhisker synthesized according to the present invention grows through a hole of Si substrate, and (a) is SEM image of the sample surface, and (b) is SEM image of the sample cross section.

FIG. 6 shows the nanowhisker growing through the hole of Si substrate, and FIG. 6(a) is SEM image of the sample surface, and FIG. 6(b) is SEM image of the sample cross section. It can be seen from SEM image of the sample surface of FIG. 6(a) that the root of nanowhisker is below Si substrate surface (shown by white arrow in the figure). It is also seen from SEM image of the sample cross section of FIG. 6(b) that there are many holes and the whisker's roots are buried fairly deep from Si substrate surface.

Figure 7:
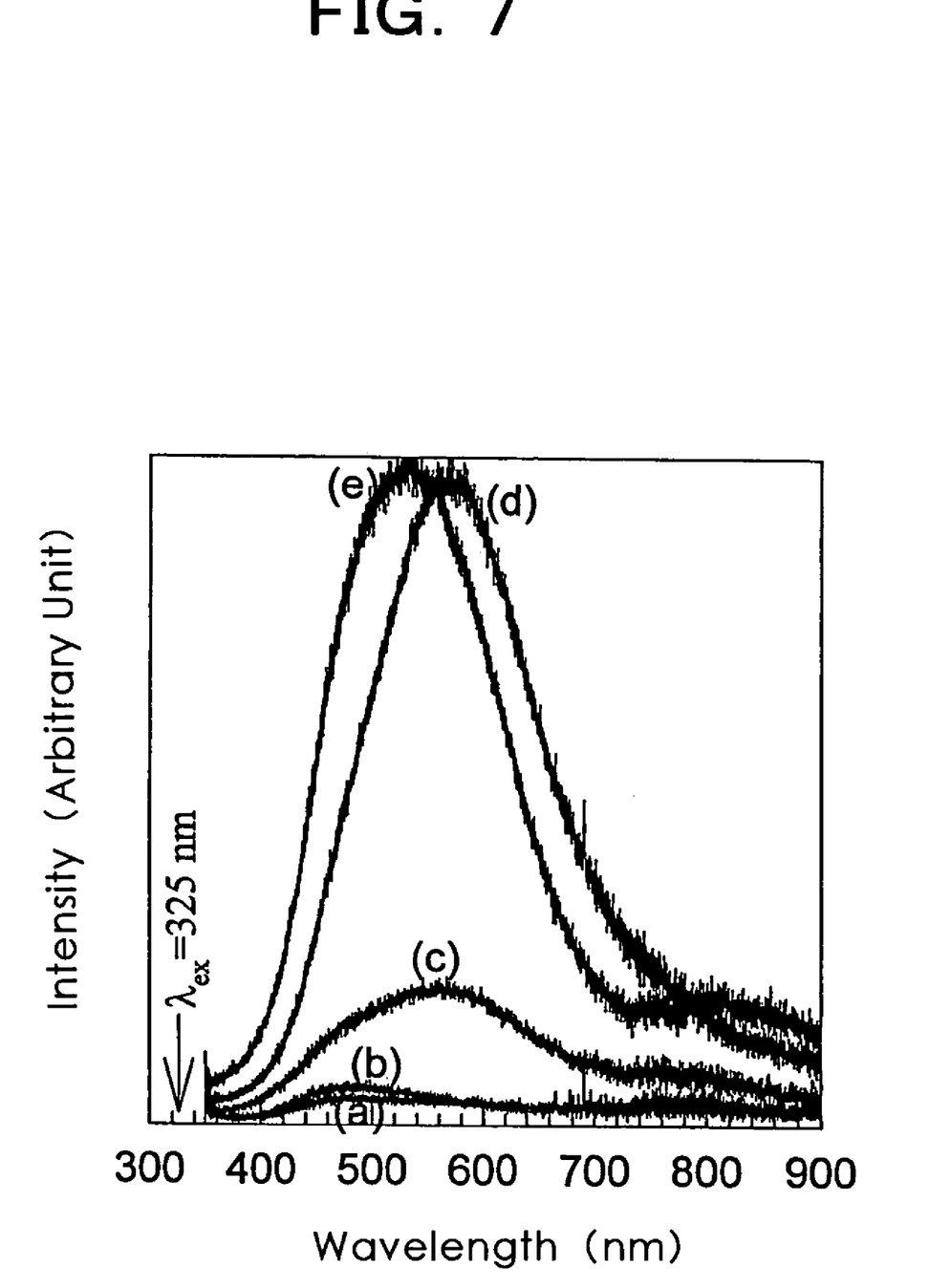
FIG. 7 is the graph showing PL spectrum of the 3C—SiC nanowhisker synthesized according to the present invention observed at room temperature.

PL(Photo Luminescence) of 3C—SiC nanowhisker synthesized by the method of the present invention is explained below FIG. 7 is PL spectrum measured at room temperature, and the wavelength of its excited light was 325 nm. PL spectra designated as (a), (b), (c), (d), and (e) in the figure are those of the samples, respectively, of 3C—SiC nanowhiskers synthesized at substrate temperature 800, 850, 900, 950, and 1000° C. As is seen from FIG. 7, PL spectrum has more or less asymmetric shape, and broad distribution which can not be separated to several simple peaks. PL intensity is increased with increase of the substrate temperature. Since it is observed by the SEM images that the amount of nanowhisker existing in unit volume on the surface of the Si substrate increases with increasing of the substrate temperature and increasing of the thickness of Fe thin film, it is considered that the increase of PL intensity mainly depend on the amount of 3C—SiC nanowhisker in the irradiation region of PL excited light.

Figure 8:
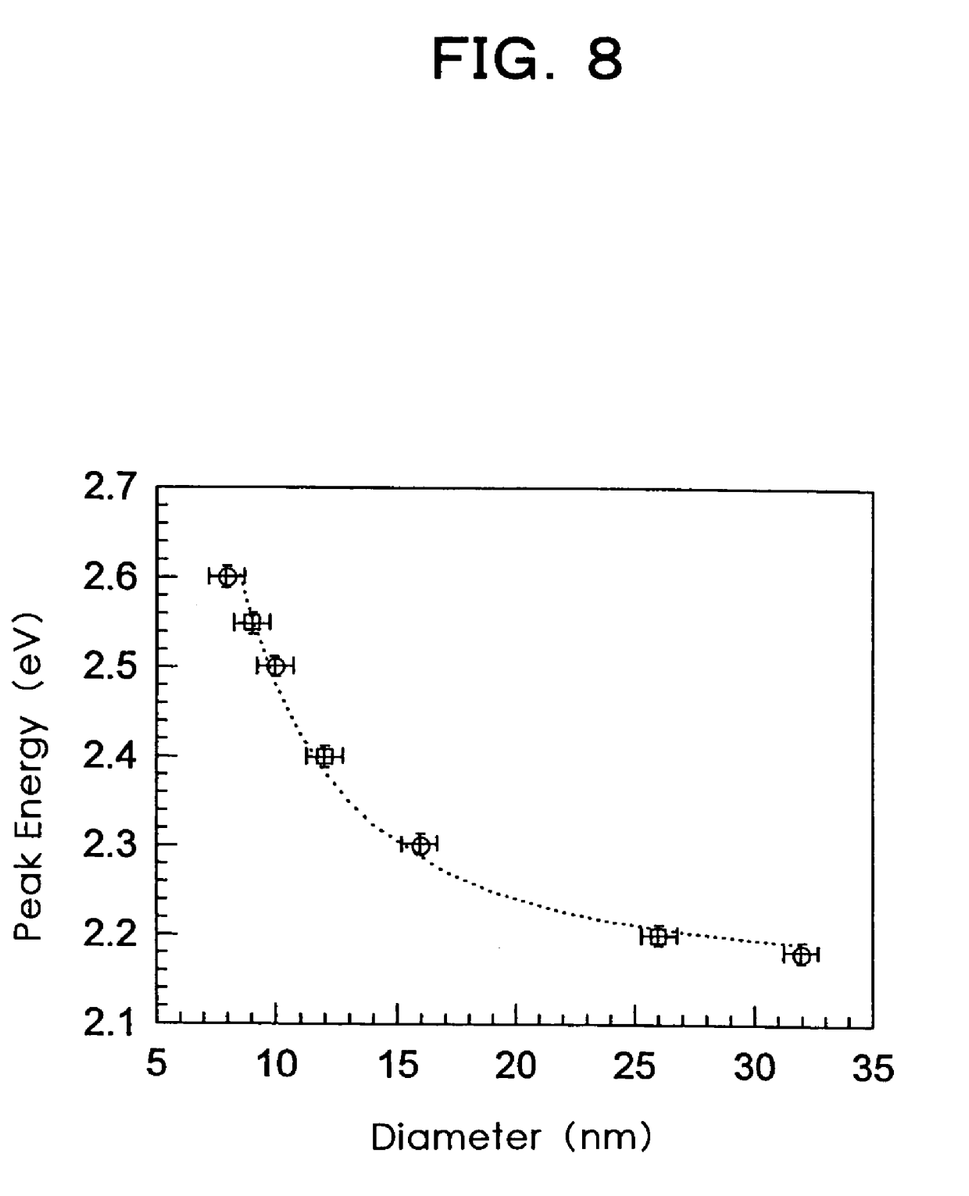
FIG. 8 is the graph showing the relationship between PL peak energy and the diameter of the 3C—SiC nanowhisker of the 3C—SiC nanowhisker synthesized according to the present invention.

Next, the relationship between PL peak energy and the diameter of 3C—SiC nanowhisker is explained. FIG. 8 shows the relationship between PL peak energy and the diameter of 3C—SiC nanowhisker, and its abscissa is the diameter of 3C—SiC nanowhisker and ordinate is PL leak energy. As is clearly seen in FIG. 8, and as expected, PL peak energy shifts to blue with decreasing the diameter of 3C—SiC nanowhisker The fact that PL peak energy varies monotonously with 3C—SiC nanowhisker diameter indicates the existence of quantum confinement effect.

The two dimensional quantum confinement effect makes it possible the PL peak energy to exceed the band gap energy of 3C—SiC in bulk form. For quantum nanowhiskers and assuming infinite potential barriers outside the whisker, Forchel et al verified a blueshift of the PL peak for the lowest energy levels of a zincblend structure and rectangular cross-sectional whisker with a fixed side length of the rectangles, and proved that the quantum energy and consequently the energy gap between electron and hole level varied as $E \propto 1/Lx^2$ with whisker width Lx (Semicond. Sci. Technol. 11, 1529, 1991).

In the present implementations, most of the 3C—SiC nanowhiskers had cylindrical cross section, and only a few had rectangular cross section, but as is clear from FIG. 8, PL peak energy ($E_{peak}$) is expressed as $$E_{peak}=2.16+32d_{m0}^{-2}(eV) \quad \text{Equation (1)},$$

where $d_{m0}$ is the most commonly occurring diameter of the 3C—SiC nanowhiskers in the sample. Though the PL peak energy may not exactly corresponds to the energy gap, the first term 2.16 eV in the first term of Equation (1) is relatively close to the energy gap of 3C—SiC in bulk form. Equation (1) is quite useful for the manufacturing of the optoelectonic device which utilize the 3C—SiC nanowhisker

INDUSTRIAL APPLICABILITY

As can be understood from the explanation above, according to the present invention, 3C—SiC nanowhisker firmly fixed on Si substrate can be synthesized densely with the controlled diameter and the length. According to the present invention, the 3C—SiC nanowhisker can be synthesized safely and at a low cost. The 3C—SiC nanowhisker of the present invention can be used as the light emitting source which is able to be manufactured by Si device manufacturing process. And extremely useful device can be formed, if the 3C—SiC nanowhisker light emitting device owing to quantum confinement effect and conventional Si device are formed on the same substrate. The 3C—SiC nanowhisker of the present invention can be used as the raw material having high carrier mobility and high saturation drift velocity for high speed electronic device of next generation, for the device operable in high temperature environment at high power, for the submicron-wavelength radiation resistant device, for the light emitting device, and as well as for the optoelectronic device

What is claimed is:

1. A synthesizing method of 3C—SiC nanowhiskers, characterized in that it comprises the steps of:
   predetermining a desired diameter of the 3C—SiC nanowhisker;
   selecting a thickness of a thin film made of a metal element or metal elements based on the predetermined desired diameter of the 3C—SiC nanowhisker;
   depositing said thin film on a Si substrate to said selected thickness; and
   holding said Si substrate in a plasma consisting of hydrogen and hydrocarbon for a time period at a substrate temperature, wherein said thin film having said selected thickness becomes a liquid phase to form metal liquid fine particles having a diameter proportional to said thickness of said thin film on said Si substrate, nuclei for said 3C—SiC nanowhiskers are formed on the surface of said metal liquid fine particles by Si atoms of said Si substrate and C atoms from said hydrocarbon decomposed in said plasma dissolving into said metal liquid fine particles, and then said 3C—SiC nanowhiskers having said predetermined desired diameter grow from said Si atoms and C atoms continuously being supplied to said nuclei,
   wherein a root of said 3C—SiC nanowhisker is buried in said Si substrate by supplying Si of said 3C—SiC nanowhisker from said Si substrate, and fixed with said Si substrate by said metal liquid fine particle existing at said root forming a silicide with said Si substrate and said 3C—SiC nanowhisker is grown perpendicular to said Si substrate.

2. A synthesizing method of 3C—SiC nanowhiskers as set forth in claim 1, characterized in that said metal element is one or more elements selected from the group which consists of Fe, Co and Ni.

3. A synthesizing method of 3C—SiC nanowhiskers as set forth in claim 1, characterized in that a length of said 3C—SiC whisker is controlled by controlling said time period and said substrate temperature.

4. A synthesizing method of 3C—SiC nanowhiskers as set forth in claim 1 or 2, characterized in that said metal element of said thin film is Fe, and said hydrocarbon is a paraffin hydrocarbon expressed as chemical formula $C_nH_{2n+2}$.

5. A synthesizing method of 3C—SiC nanowhiskers as set forth in claim 4, characterized in that said thin film has thickness between 5 nm and 105 nm.

6. A synthesizing method of 3C—SiC nanowhiskers as set forth in claim 1, characterized in that said substrate temperature is 800 to 1100° C.

7. A synthesizing method of 3C—SiC nanowhiskers as set forth in claim 1 or 3, characterized in that said plasma is microwave plasma.

8. A method of synthesizing 3C—SiC nanowhiskers as set forth in claim 1 or 2, characterized in that the hydrocarbon is methane.

9. A method of synthesizing 3C—SiC nanowhiskers as set forth in claim 1 or 2, characterized in that the hydrocarbon is ethane.

10. A method of synthesizing 3C—SiC nanowhiskers as set forth in claim 1 or 2, characterized in that the hydrocarbon is butane.

* * * * *